(12) United States Patent
Svedin et al.

(10) Patent No.: US 10,830,853 B1
(45) Date of Patent: Nov. 10, 2020

(54) SIMULTANEOUS PROTON RESONANCE FREQUENCY SHIFT THERMOMETRY AND $T_1$ MEASUREMENTS USING A SINGLE REFERENCE VARIABLE FLIP ANGLE $T_1$ METHOD

(71) Applicant: University of Utah Research Foundation, Salt Lake City, UT (US)

(72) Inventors: Bryant Svedin, West Jordan, UT (US); Dennis L. Parker, Centerville, UT (US); Allison Payne, Salt Lake City, UT (US)

(73) Assignees: Siemens Healthcare GmbH, Erlangen (DE); University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 16/388,931

(22) Filed: Apr. 19, 2019

(51) Int. Cl.
*G01R 33/561* (2006.01)
*G01R 33/48* (2006.01)

(52) U.S. Cl.
CPC ..... *G01R 33/5615* (2013.01); *G01R 33/4824* (2013.01); *G01R 33/4828* (2013.01)

(58) Field of Classification Search
CPC ............ G01R 33/5615; G01R 33/4824; G01R 33/4828
See application file for complete search history.

(56) References Cited

U.S. PATENT DOCUMENTS

| | | | | |
|---|---|---|---|---|
| 2004/0032259 | A1* | 2/2004 | Dixon | G01R 33/4835 324/307 |
| 2005/0165296 | A1* | 7/2005 | Ma | G01R 33/56563 600/410 |
| 2008/0091099 | A1* | 4/2008 | Carasso | G01R 33/56 600/410 |
| 2010/0185081 | A1* | 7/2010 | Soher | G01R 33/485 600/412 |
| 2012/0049846 | A1* | 3/2012 | Gross | G01R 33/565 324/309 |

(Continued)

OTHER PUBLICATIONS

Chung, Sohae, et al. "Rapid B1+ mapping using a preconditioning RF pulse with TurboFLASH readout." Magnetic resonance in medicine 64.2 (2010): 439-446.

(Continued)

*Primary Examiner* — G.M. A Hyder

(57) ABSTRACT

A computer implemented method for measuring $T_1$ in an anatomical region of interest during a dynamic procedure includes acquiring a reference MR image of the anatomical region of interest using a first flip angle. A first set of dynamic MR images of the anatomical region of interest are acquired using a second flip angle. The reference MR image and the first set are used to calculate a reference $T_1$ value for tissue in the anatomical region of interest. During an intervention where the $T_1$ value may change, a second set of dynamic MR images of the anatomical region of interest is acquired using the second flip angle. The reference MR image and the second set are used to calculate an estimated $T_1$ value. The reference $T_1$ value, the estimated $T_1$ value, and the first and second flip angles may then be used to correct the estimated $T_1$ value.

19 Claims, 12 Drawing Sheets

(56) References Cited

U.S. PATENT DOCUMENTS

| | | | | |
|---|---|---|---|---|
| 2012/0068703 A1* | 3/2012 | Gross | ............... | G01R 33/50 |
| | | | | 324/309 |
| 2012/0134565 A1* | 5/2012 | Gross | ............ | G01R 33/4828 |
| | | | | 382/131 |
| 2012/0224757 A1* | 9/2012 | Gross | ........... | G01R 33/56563 |
| | | | | 382/131 |
| 2013/0158387 A1* | 6/2013 | Tanttu | ............ | A61B 5/7278 |
| | | | | 600/411 |
| 2014/0021951 A1* | 1/2014 | Liu | ............... | G01R 33/561 |
| | | | | 324/309 |
| 2018/0203084 A1* | 7/2018 | An | ............... | G01R 33/4812 |
| 2019/0076080 A1* | 3/2019 | Prado | ............ | A61B 5/4872 |

OTHER PUBLICATIONS

Block, Kai Tobias, et al. "Towards routine clinical use of radial stack-of-stars 3D gradient-echo sequences for reducing motion sensitivity." Journal of the Korean Society of Magnetic Resonance in Medicine 18.2 (2014): 87-106.

Svedin, Bryant T., et al. "Multiecho pseudo-golden angle stack of stars thermometry with high spatial and temporal resolution using k-space weighted image contrast." Magnetic resonance in medicine 79.3 (2018): 1407-1419.

Schabel, Matthias C., and Glen R. Morrell. "Uncertainty in T1 mapping using the variable flip angle method with two flip angles." Physics in Medicine & Biology 54.1 (2008): N1.

* cited by examiner

SIMULTANEOUS PROTON RESONANCE FREQUENCY SHIFT THERMOMETRY AND $T_1$ MEASUREMENTS USING A SINGLE REFERENCE VARIABLE FLIP ANGLE $T_1$ METHOD

STATEMENT REGARDING FEDERALLY SPONSORED RESEARCH OR DEVELOPMENT

This invention was made with government support under Grant Numbers CA172787, EB013433, CA224141, and OD018482 awarded by the National Institutes of Health. The government has certain rights in the invention.

TECHNICAL FIELD

The present invention relates generally to performing simultaneous proton resonance frequency (PRF) shift and $T_1$ measurements with equivalent temporal resolution using a single reference variable flip angle (VFA) method. The techniques described herein facilitate, among other things, simultaneous thermometry in both aqueous and fatty tissue.

BACKGROUND

Magnetic resonance temperature imaging (MRTI) has been used to monitor several kinds of thermal therapies including radiofrequency, microwave, laser and MR-guided focused ultrasound (MRgFUS). MRgFUS has been used to noninvasively treat breast, prostate, liver and brain cancers as well as essential tremor and Parkinson's disease. In order to ensure treatment safety and efficacy, it is desirable that MRTI be able to monitor the entire heated tissue volume with enough temporal resolution to accurately follow the most rapid temperature changes. The different types of thermal therapy pose different challenges in terms of the needed coverage and acquisition speed. MRgFUS is especially challenging because the ultrasound often traverses a large volume of normal tissue before being focused to a point where rapid heating occurs. Thus, ideally, for MRgFUS, MRTI would monitor the focus and the near and far-fields with full coverage and high temporal resolution.

The PRF shift method has been widely adopted due to its linearity over the temperature range of interest, the constant of proportionality being largely independent of tissue type (except adipose tissue), and its ability to produce temperature maps with the spatial and temporal resolution required to monitor treatments in real time. There have been several successful implementations of fully 3D thermometry methods using the proton resonance frequency (PRF) shift thermometry technique. However, many FUS treatment targets are surrounded by or have adipose tissue in the near field (e.g., breast, abdominal targets) and PRF thermometry is unable to monitor temperature changes in adipose tissue. Thus, it is desired to provide a method of that allows for simultaneous thermometry in both aqueous and adipose tissue.

SUMMARY

Embodiments of the present invention address and overcome one or more of the above shortcomings and drawbacks, by providing methods, systems, and apparatuses related to the simultaneous proton resonance frequency shift thermometry and $T_1$ measurements using a single reference variable flip angle $T_1$ method. Briefly, the techniques described herein allow for rapid simultaneous PRF and $T_1$ thermometry techniques, providing $T_1$ images with the temporal resolution equivalent to the magnitude image. The disclosure that follows presents the theory behind single reference VFA $T_1$ calculations and the optimal sequence parameters for simultaneous PRF and single reference VFA $T_1$, determined using Monte Carlo simulations of noisy signal as a function of flip angle.

According to some embodiments, a computer implemented method for measuring $T_1$ in an anatomical region of interest during a dynamic procedure includes acquiring a reference magnetic resonance (MR) image of the anatomical region of interest using a first flip angle. A first set of dynamic MR images of the anatomical region of interest are acquired using a second flip angle that is distinct from the first flip angle. The reference MR image and the first set of dynamic MR images are each acquired while the anatomical region of interest was at substantially the same temperature. The reference MR image and the first set of dynamic MR images are used to calculate a reference $T_1$ value for tissue in the anatomical region of interest. During an intervention where the $T_1$ value may change, a second set of dynamic MR images of the anatomical region of interest is acquired using the second flip angle. The reference MR image and the second set of dynamic MR images are used to calculate an estimated $T_1$ value. The reference $T_1$ value, the estimated $T_1$ value, and the first and second flip angles may then be used to correct the estimated $T_1$ value to take into account the change in $T_1$ value due to the intervention to obtain an updated $T_1$ value for the dynamic MR images.

In other embodiments, an article of manufacture for measuring $T_1$ in an anatomical region of interest during a thermal therapy procedure comprises a non-transitory, tangible computer-readable medium holding computer-executable instructions for performing the method discussed above.

According to another aspect of the present invention, a system for measuring $T_1$ in an anatomical region of interest during a thermal therapy procedure comprises a plurality of imaging coils and a control computer. The imaging coils are used to perform at least 3 acquisitions. First, a reference MR image of the anatomical region of interest is acquired using a first flip angle. Second, a first set of dynamic MR images of the anatomical region of interest is acquired using a second flip angle that is distinct from the first flip angle. The reference MR image and the first set of dynamic MR images are each acquired while the anatomical region of interest was at substantially the same temperature. Third, during an intervention where the $T_1$ value may change, a second set of dynamic MR images of the anatomical region of interest is acquired using the second flip angle. The control computer uses the reference MR image and the first set of dynamic MR images to calculate a reference $T_1$ value for tissue in the anatomical region of interest. The reference MR image and the second set of dynamic MR images are used to calculate an estimated $T_1$ value. Then, the reference $T_1$ value, the estimated $T_1$ value, and the first and second flip angles may be used to correct the estimated $T_1$ value to take into account the change in $T_1$ value due to the intervention to obtain an updated $T_1$ value for the dynamic MR images.

Additional features and advantages of the invention will be made apparent from the following detailed description of illustrative embodiments that proceeds with reference to the accompanying drawings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

Figure 1:
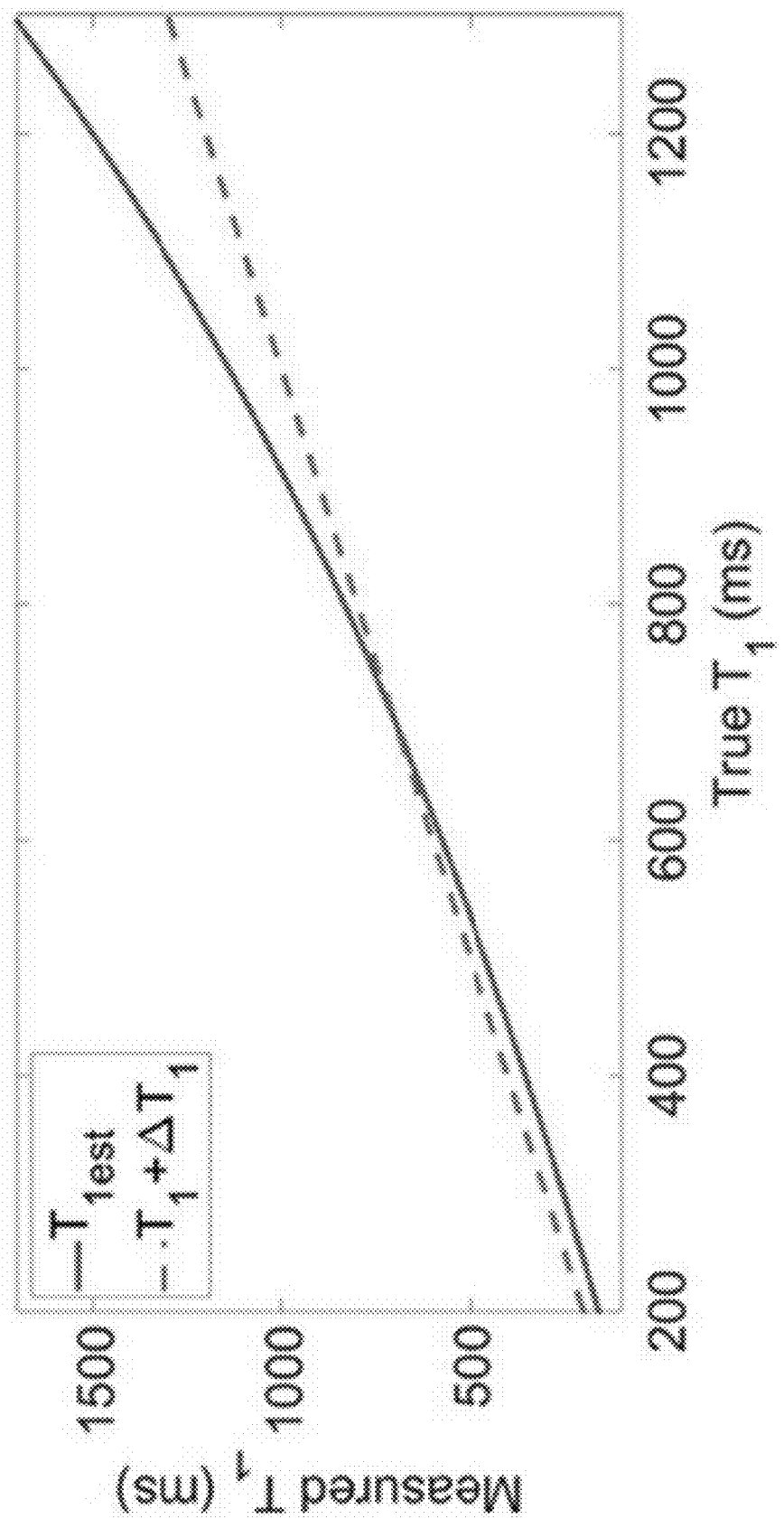
FIG. 1 shows the measured $T_1$ versus true $T_1$ using the single reference VFA method without correction (depicted in solid blue) and with correction using Equation 6 (depicted in dashed red)

The present disclosure describes systems and methods for Simultaneous Proton Resonance Frequency Shift Thermometry and $T_1$ Measurements Using a Single Reference Variable Flip Angle $T_1$ Method. More specifically, the technology disclosed herein acquires a single reference image at the lower flip angle and all dynamic images at the higher flip angle. $T_1$ is calculated using a single reference VFA method, which accounts for the reference image temperature remaining constant. The single reference VFA technique discussed herein provides a reliable way to simultaneously measure PRF temperature and $T_1$ change and overcomes PRF's inability to simultaneously monitor temperature in aqueous and adipose tissues. Real time temperature in fat will increase patient safety and treatment efficacy. The techniques described herein are especially applicable to interventional treatments in inhomogeneous tissue types containing large amounts of adipose tissue such as the breast or abdominal targets.

The VFA method for measuring $T_1$ uses the spoiled gradient recalled steady state signal as set forth in Equation 1:

$$s = M_0 \frac{(1 - E_1)\sin(\alpha)}{1 - E_1 \cos(\alpha)} E_2 \quad (1)$$

where $E_1=\exp(-TR/T_1)$, $E_2=\exp(-TE/T_2^*)$, $M_0$ is the equilibrium magnetization, a is the flip angle, TR is the pulse repetition time, TE is the sequence echo time, and $T_1$ and $T_2$ are the longitudinal and observed transverse relaxation times, respectively. Equation 1 is derived with the assumption that either $TR \gg T_2^*$ or adequate spoiling is used to ensure that negligible transverse signal remains before subsequent excitations. If these conditions are not true, Equation 1 will not accurately describe the signal and significant errors in $T_1$ calculation will occur. $T_1$ is calculated from the linearized form of Equation 1.

$$\frac{s}{\sin(\alpha)} = E_1 \frac{s}{\tan(\alpha)} + M_0(1 - E_1)E_2 \quad (2)$$

The signal from applying two different flip angles ($\alpha$ and $\beta$) can be used in Equation 2 to calculate the slope m, which is equal to an estimate of $E_1$ ($E_{1est}$):

$$E_{1est} = m = \frac{y_2 - y_1}{x_2 - x_1} \quad (3)$$

$$y_2 = \frac{S_2}{\sin(\beta)}, \; y_1 = \frac{S_1}{\sin(\alpha)}, \; x_2 = \frac{S_2}{\tan(\beta)}, \; x_1 = \frac{S_1}{\tan(\alpha)}$$

$T_1$ is then calculated from the slope using Equation 4:

$$T_1 = \frac{-TR}{\ln(m)} \quad (4)$$

The single reference VFA method acquires a single reference image at the lower flip angle α and then acquires dynamic images at the higher flip angle β. Estimates of $T_1$ using the original VFA method ($T_{1est}$) will have a systematic error because the $T_1$ of the dynamic images will change with temperature, while the reference image is constant. The actual $T_1$ of the dynamic images can be calculated with a simple correction. The signals from the reference and dynamic images are given Equation 5:

$$S_r = M_0 \frac{(1-E_1)\sin(\alpha)}{1-E_1\cos(\alpha)} E_2 \quad (5)$$

$$S_d = M_0 \frac{(1-E_{1d})\sin(\beta)}{1-E_{1d}\cos(\beta)} E_2$$

where $E_{1d}=\exp(-TR/(T_1+\Delta T_1))$, and $\Delta T_1$ is the change in $T_1$ due to temperature change. Substituting Equation (5) into Equation (3), where $S_d=S_2$ and $S_r=S_1$, yields:

$$T_1 + \Delta T_1 = \frac{-TR}{\ln\left(\frac{1-\gamma}{1-\gamma\cos(\beta)}\right)} \quad (6)$$

$$\gamma = \frac{1-E_1}{1-E_1\cos(\alpha)} \frac{1-E_{1est}\cos(\alpha)}{1-E_{1est}\cos(\beta)}$$

Equation 6 requires knowing the baseline $T_1$ value. The value for $E_1$ can be calculated using the signal from the reference image ($S_r$) and the baseline images of the dynamic images ($S_d$) before the heating begins. The baseline images are taken while the tissue in the region of interest is substantially at the same temperature as it was during acquisition of the reference image. In this context "substantially the same temperature" refers to a temperature difference of less than or equal to 5 degrees Fahrenheit. The true $T_1+\Delta T_1$ is calculated by first calculating the $E_{1est}$, which is incorrect, and then applying the correction in Equation (6) using the baseline $E_1$ value, the TR, and the flip angles used.

The potential systematic error is shown in FIG. 1. More specifically, FIG. 1 shows the measured $T_1$ versus true $T_1$ using the single reference VFA method without correction (depicted in solid blue) and with correction using Equation 6 (depicted in dashed red). Baseline $T_1$ was 700 ms. This example shows that the calculated $T_{1est}$ overestimates the true $T_1$ as $T_1$ increases from the baseline value and will underestimate the true $T_1$ if $T_1$ decreases from the baseline.

Flip Angle Sensitivity Simulations

To simulate the sensitivity of single reference VFA $T_1$ measurements to noise and to determine the optimal choice of flip angles for the single reference VFA method, noisy measurements were simulated using a Monte Carlo technique for a range of flip angles. The effects of $T_2$ decay were ignored and TR was set to 10 ms. The reference steady state signal values were calculated for flip angles from 1 to 90° in 1° increments for $T_1$=300 ms using Equation 1. Dynamic steady state signal values were calculated for the same flip angles and for $T_1$ values from 200 to 900 ms in 10 ms increments. White Gaussian noise was added to each reference and dynamic signal value 1000 different times. $T_1$ values were calculated for every combination of flip angles using equation 3 and then corrected using equation 6. The standard deviation ($\sigma_{T_1}$) at each flip angle combination was calculated from the 1000 noisy estimates.

Flip Angle Correction/B1 Mapping

Various techniques known in the art may be used for performing the B1 mapping. One example method is described in Chung S, Kim D, Breton E, Axel L. Rapid B(1)(+) Mapping Using a Pre-Conditioning RF Pulse with TurboFLASH readout. Magnetic resonance in medicine: official journal of the Society of Magnetic Resonance in Medicine/Society of Magnetic Resonance in Medicine 2010; 64(2):439-446. The method uses the ratio between two proton density images, $I_{PD}$ where one of the images has been pre-saturated by a slice selective pulse, $I_{PRE}$. The images were acquired with a centric reordered turbo fast low angle shot (turboFLASH) MRI sequence to decrease scan time. The ratio of the two images is related to the nominal flip angle of the saturation pulse, $\Theta_{nom}$, by $$\frac{I_{PRE}}{I_{PD}} = \cos(\kappa(r) \cdot \theta_{nom}) \quad (7)$$

where κ(r) is a flip angle scale factor at position r, which by definition is the actual flip angle divided by nominal flip angle. Equation 7 can be rewritten as $$\kappa(r) = \frac{1}{\theta_{nom}} \cos^{-1} \frac{I_{PRE}}{I_{PD}} \quad (8)$$

In the example implementation described below, the flip angle of the pre-saturation pulse was set to $\theta_{nom}$=60° for this work. The data acquisition was started as quickly as possible (10 ms) after the pre-saturation to minimize the effects of $T_1$ relaxation, which are ignored. A centric k-space reordering also minimizes the effects of $T_1$ relaxation, which can be minimized further by segmenting the acquisition into multiple "shots." The original method by Chung acquired a single 2D slice, which could be acquired rapidly in a single shot. During the example implementation, 3D maps were acquired which required segmenting the data acquisition to maintain the proton density weighting. Both images were filtered with a Hamming window along the phase encoding direction before reconstruction.

MRgFUS Experiments

An experiment was performed in a Siemens Prisma 3T MRI scanner (Siemens Healthcare, Erlangen, Germany) using the MRI-compatible phased-array transducer (256 elements, 1 MHz frequency, 10 cm radius of curvature; Imasonic, Besancon, France and Image Guided Therapy, Pessac, France) from a breast-specific MRgFUS system to evaluate the single reference VFA method. Two human cadaver breasts from different donors preserved with formalin were positioned such that the ultrasound focus was approximately 3 cm deep in the cadaver breast.

Figure 2:
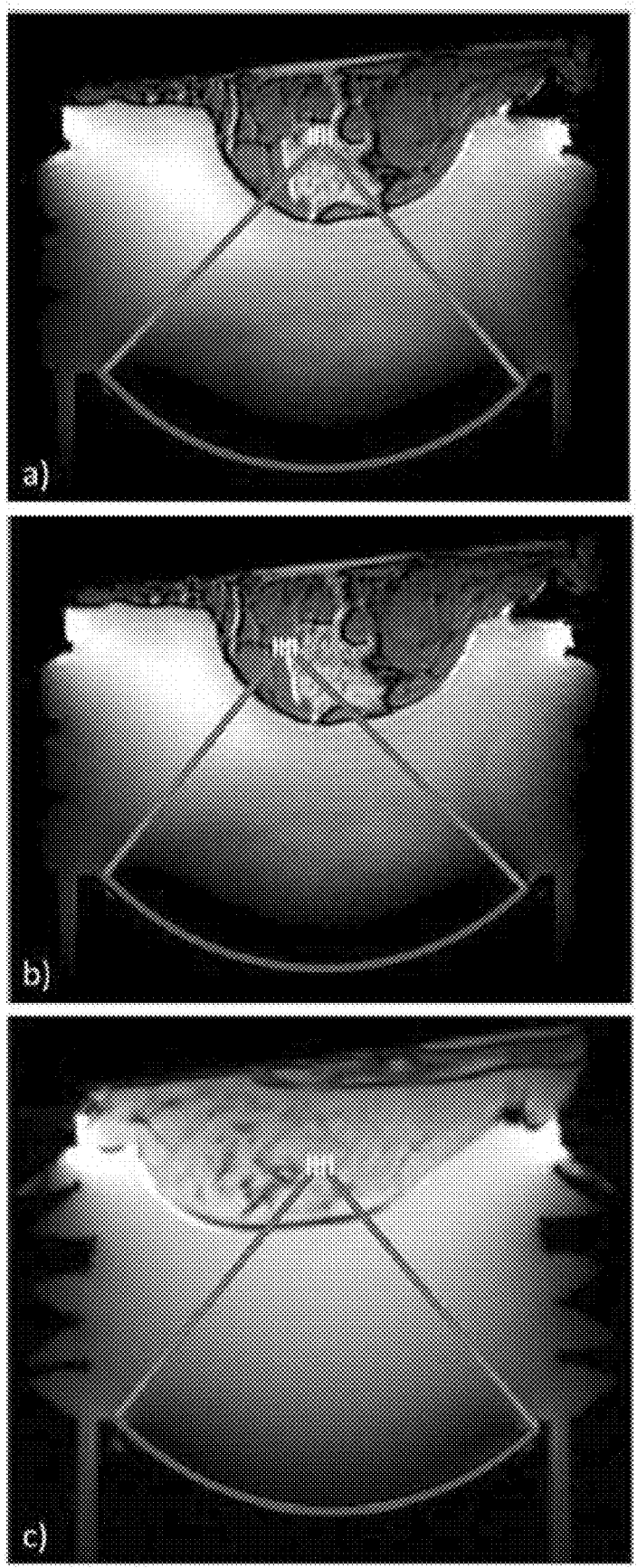
FIG. 2 shows the experiment setup for the first ultrasound heating at a first point in the first cadaver breast (labeled "a"), the second ultrasound heating in the first cadaver breast (labeled "b") and the third ultrasound heating in the second cadaver breast (labeled "c")

FIG. 2 shows the experiment setup for the first ultrasound heating (labeled "a"), the second ultrasound heating in the first cadaver breast (labeled "b") and the third ultrasound heating in the third cadaver breast (labeled "c"). The ultrasound transducer is outlined with the blue line at the bottom of each image and the ultrasound propagation envelope is shown with the red lines. The yellow ovals are the approximate locations for each of the electronically steered focal locations.

In the example of FIG. 2, the single reference VFA angle was used in conjunction with a multi-echo linearly rotated stack-of-stars (RSOS) imaging sequence with an in-plane pseudo-golden angle increment. One example implementation of the SOS method is described in Block K T, Chandarana H, Milla S, Bruno M, Mulholland T, Fatterpekar G, Hagiwara M, Grimm R, Geppert C, Kiefer B, Sodickson D K. Towards Routine Clinical Use of Radial Stack-of-Stars 3D Gradient-Echo Sequences for Reducing Motion Sensitivity. J Korean Soc Magn Reson Med 2014; 18(2):87-106. However, it should be understood that other types of acquisition sequences (e.g., other spiral-based techniques and non-spiral based) may be used in implementing the single reference VFA angle technique described herein.

The images shown in FIG. 2 were reconstructed with a dynamic (KWIC) reconstruction to increase the temporal resolution. An example implementation of KWIC is described in Svedin B T, Payne A, Bolster B D, Jr., Parker D L. Multiecho pseudo-golden angle stack of stars thermometry with high spatial and temporal resolution using k-space weighted image contrast. Magn Reson Med 2017. As with the use of SOS, the use of KWIC for reconstruction is intended to be exemplary; and other reconstruction methods may be used to reconstruct the various images used in the techniques described herein.

The 3D imaging volume was prescribed in a sagittal orientation (voxel size=1.3 mm isotropic; field of view=208×208×20.8 mm; matrix=160×160×16; 1514 radial projections; TR=10.5 ms; TE=2.46$_{1.23}$*n, n=0 to 5 ms; readout bandwidth=1200 Hz/pixel). The reference image flip angle was α=5° and the dynamic images flip angle (β=15°) was set to the Ernst angle for the fat tissue. The first cadaver breast was heated with two ultrasound sonications, each in a different location using electronic steering, while imaging with the RSOS sequence. The second cadaver breast was heated with one ultrasound sonication. The ultrasound sonicated a linear pattern composed of four discrete points (each separated by 2 mm, 50 ms per point) at 75 acoustic watts for 30 seconds total. A breast shaped homogenous gelatin phantom was also sonicated with the same parameters. B1 maps for each phantom were acquired using the method described above (voxel size=2.6 mm isotropic zero-filled to 1.3 mm isotropic; field of view=208× 208×20.8 mm; 40 lines per TR; TR=5000 ms; TE=1.31 ms).

Image Reconstruction

The gpuNUFFT algorithm was used to reconstruct the non-Cartesian data. The dynamic images were reconstructed using a sliding symmetric KWIC window with 13 central projections and 377 total projections and the sliding window was advanced 13 projections between reconstructions. The effective temporal resolution of the KWIC reconstructed images was 2.18 s. The reference images were reconstructed without a KWIC window and using all of the collected data. Separate water and fat images were created using the 3-point Dixon method from the first three echoes for the reference image and each dynamic image. $T_1$ values were calculated using the single reference VFA method described above using the separated water/fat images and acquired B1 maps. The change in $T_1$ from a trajectory matched baseline value was calculated for each image. The phase information from each echo was combined using a weighted linear least squares fit and the PRF temperatures were calculated using the trajectory matched baseline described in Svedin B T, Payne A, Bolster B D, Jr., Parker D L. Multiecho pseudo-golden angle stack of stars thermometry with high spatial and temporal resolution using k-space weighted image contrast (KWIC). Magn Reson Med 2017. The change in $T_1$ is compared to PRF temperature values in aqueous tissue.

Results

Figure 3:
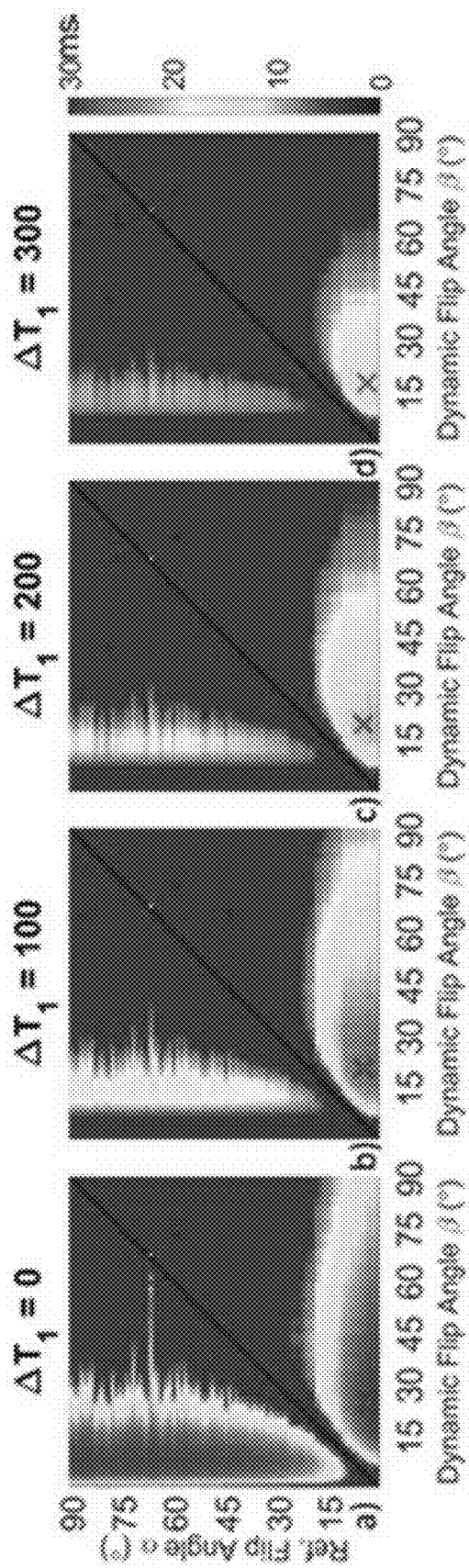
FIG. 3 shows the standard deviation of the $T_1$ measurement for each flip angle combination using the single reference VFA method for a baseline $T_1$ of 300 ms and TR=10 ms for $\Delta T_1=0$ ms (labeled "a"), $\Delta T_1=100$ ms (labeled "b"), $\Delta T_1=200$ ms (labeled "c"), and $\Delta T_1=300$ ms (labeled "d")

The Monte Carlo simulations of the single reference VFA precision are shown in FIG. 3 for several values of $\Delta T_1$. Specifically, FIG. 3 shows the standard deviation of the $T_1$ measurement for each flip angle combination using the single reference VFA method for a baseline $T_1$ of 300 ms and TR=10 ms for $\Delta T_1$=0 ms (labeled "a"), $\Delta T_1$=100 ms (labeled "b"), $\Delta T_1$=200 ms (labeled "c"), and $\Delta T_1$=300 ms (labeled "d"). The red x is the smoothed estimate of the flip angle choices that give the minimum standard deviation.

Similar to the standard VFA method, the measurement precision is best when the two flip angles chosen are on opposite sides of the Ernst angle. The precision varies rapidly when varying the smaller flip angle and is relatively forgiving when varying the larger flip angle. The optimal flip angle combination changes with $\Delta T_1$, but the choice of reference flip angle remained constant. For the simulated scan parameters, the optimal choice of reference flip angle was 5°. As $\Delta T_1$ increases, the optimal choice for the dynamic flip angle approaches but does not go lower than the original baseline Ernst angle.

Figure 4:
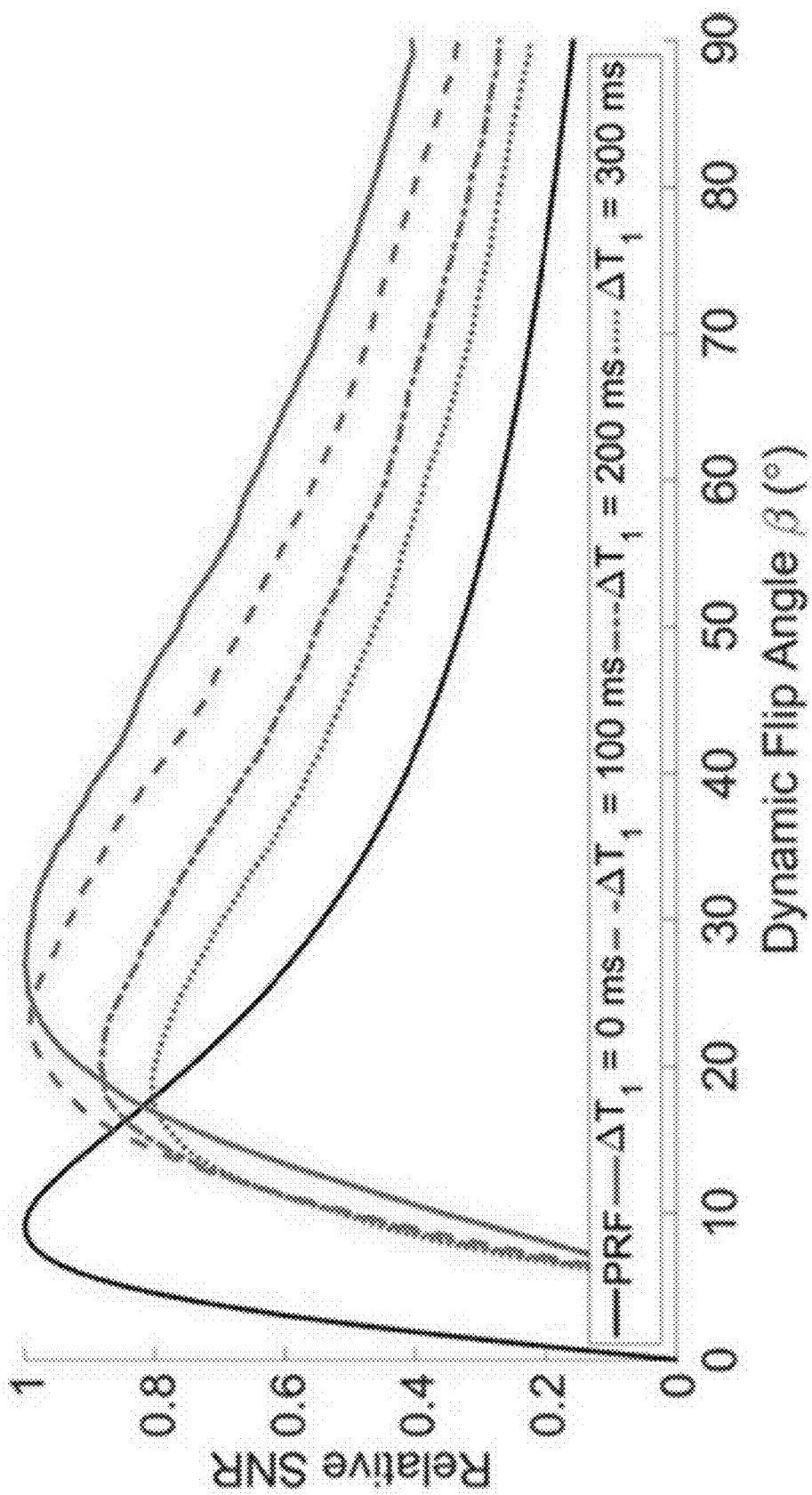
FIG. 4 shows relative SNR of PRF measurements for a tissue with $T_1=800$ ms and single reference VFA $T_1$ measurements with a baseline $T_1=300$ ms and the reference flip angle=5° as a function of dynamic flip angle choice this figure also shows the SNR of the PRF method for the same tissue as a function of flip angle.

The relative SNR of PRF measurements for a tissue with $T_1$=800 ms and single reference VFA $T_1$ measurements with a baseline $T_1$=300 ms and the reference flip angle=5° as a function of dynamic flip angle choice is shown in FIG. 4. In FIG. 4, relative PRF SNR is shown in black, while $T_1$ measurement SNR is shown in red. Relative $T_1$ SNR is equal to the standard deviation divided by $T_1+\Delta T_1$ and then normalized to the maximum value of $\Delta T_1$=0 ms.

Figure 5:
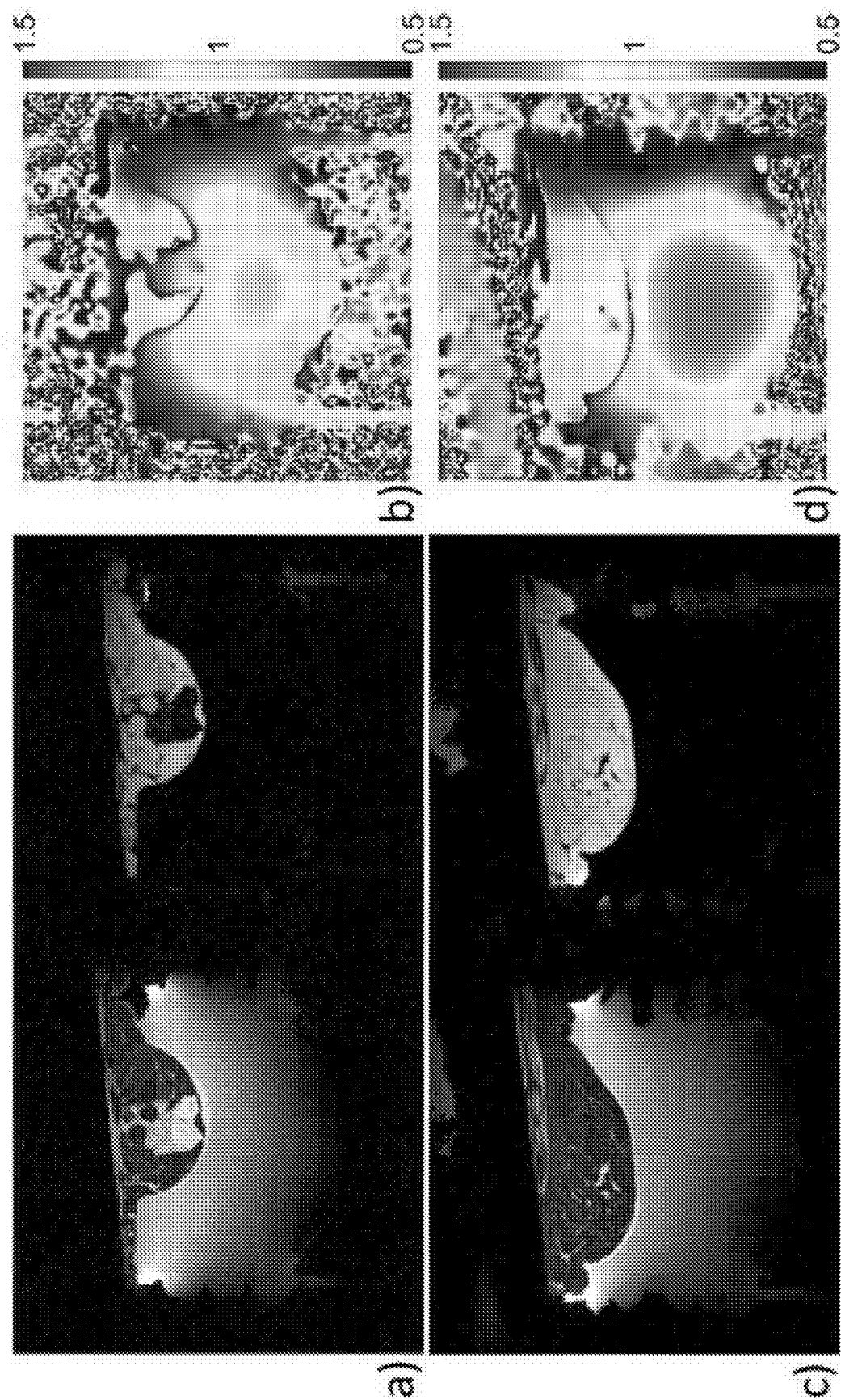
FIG. 5 shows separated water and fat images for the first cadaver breast (labeled "a") and the second cadaver breast (labeled "c"); Also shown are the flip angle maps obtained using the pre-saturation pulse technique for the first cadaver breast (labeled "b") and the second cadaver breast (labeled "d").

FIG. 5 shows separated water and fat images for the first cadaver breast (labeled "a") and the second cadaver breast (labeled "c"). Also shown are the flip angle maps obtained using the pre-saturation pulse technique for the first cadaver breast (labeled "b") and the second cadaver breast (labeled "d"). In each image labeled "a" and "b", the water images are shown on the left, while the fat image are on the right. The color maps labeled "b" and "d" show the B1 map acquired using the pre-saturation pulse technique for the first and second cadaver breasts, respectively. Cadaver breast 1 had a mix of fibroglandular tissue and fat while cadaver breast 2 was comprised primarily of fat.

Figure 6:
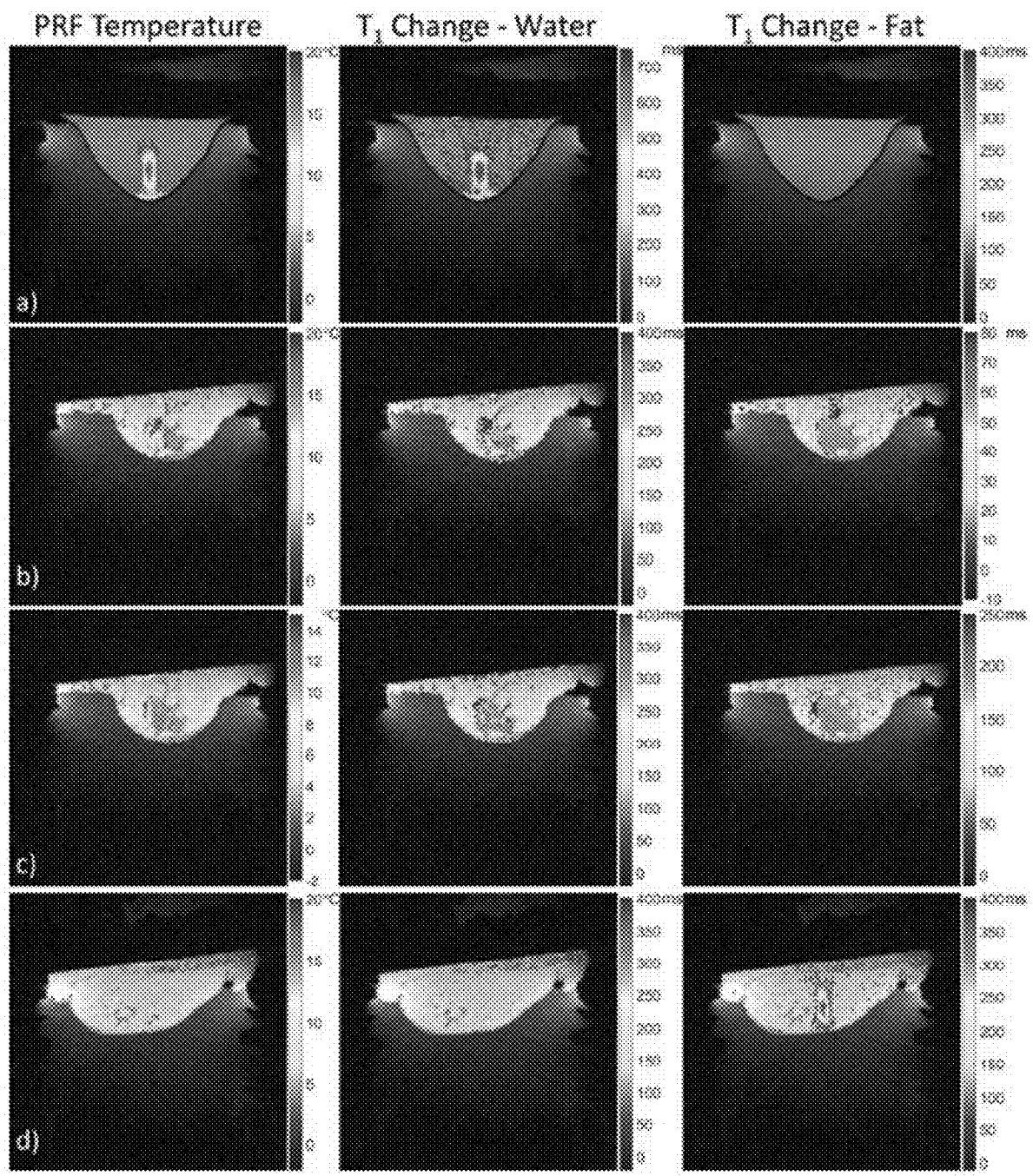
FIG. 6 shows images of the maximum temperature time point for the gelatin phantom (labeled "a"), the first sonication trajectory (labeled "b") and the second sonication trajectory (labeled "c") in the first cadaver breast and the first sonication trajectory (labeled "d") in the second cadaver breast.

Images of the PRF temperature, the $T_1$ change in water voxels and the $T_1$ change in fat voxels for the gelatin phantom and cadaver breasts during ultrasound sonication are shown in FIG. 6 at the time of the peak temperature rise. More specifically, FIG. 6 shows images of the maximum temperature time point for the gelatin phantom (labeled "a"), the first sonication trajectory (labeled "b"), the second sonication trajectory in the first cadaver breast and the second cadaver breast (labeled "c" and "d," respectively). The left column of images in FIG. 6 shows the PRF temperature maps in aqueous tissue. The middle column of images shows the $T_1$ change in aqueous tissue voxels. Finally, the right column of images in FIG. 6 shows the $T_1$ change in adipose tissue voxels. The PRF temperature and $T_1$ change in water voxels are masked to only be shown in water voxels and the $T_1$ change in fat is only shown for fat voxels.

Figure 7:
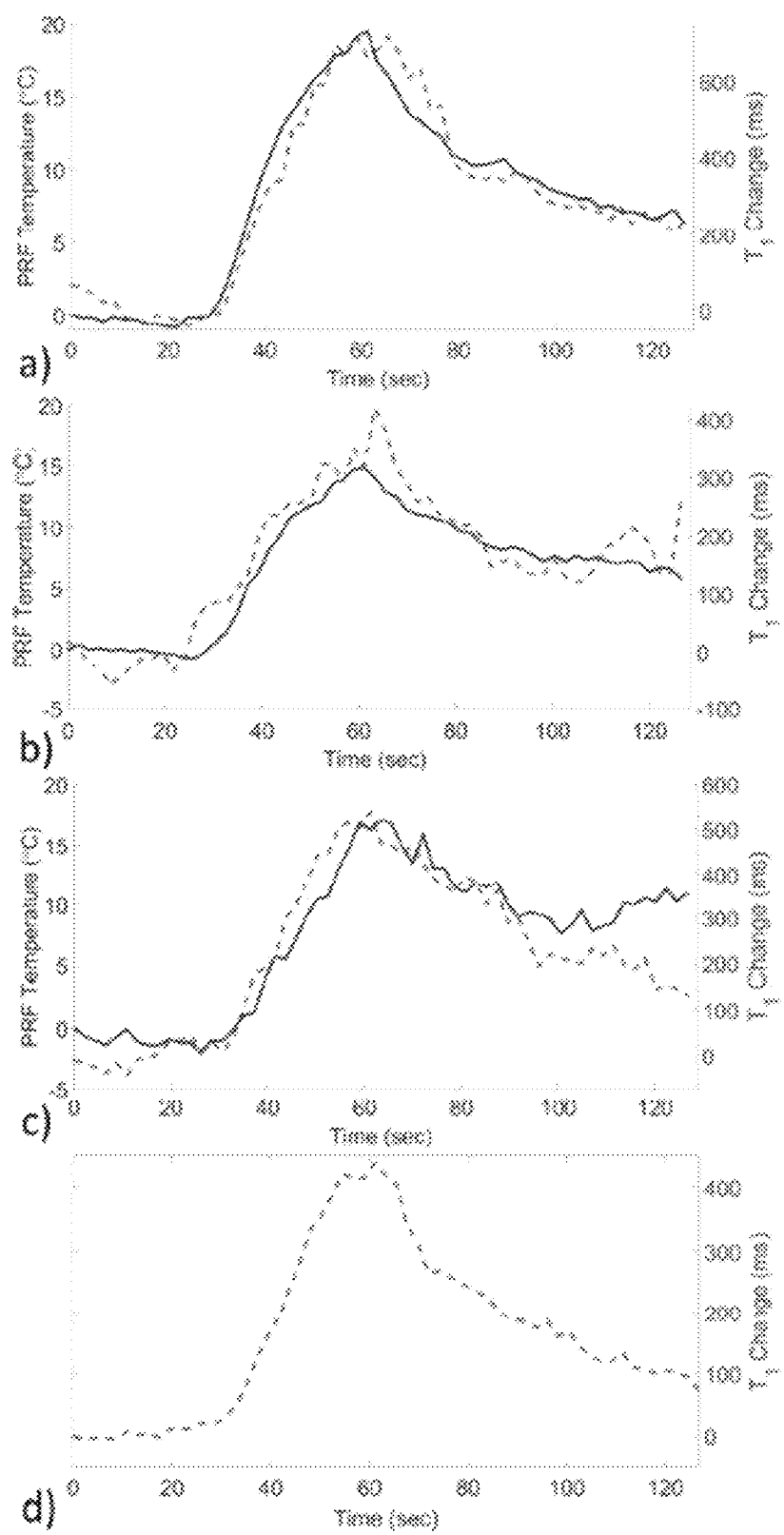
FIG. 7 shows the PRF temperature (° C., black) and $T_1$ change (ms, red) versus time in in the same voxel in the gelatin phantom (labeled "a"), in the same aqueous tissue voxel in the first cadaver breast (labeled "b"), in adjacent fat and aqueous voxels in the second cadaver breast (labeled "c"), and in a fat voxel in the second cadaver breast (labeled "d")

FIG. 7 shows the PRF temperature (° C., black) and $T_1$ change (ms, red) versus time in each model. The plot labeled "a" depicts the measurements obtained both from the same voxel in the gelatin phantom; the plot labeled "b" depicts the measurements from the same aqueous tissue voxel from the first ultrasound sonication in the first cadaver breast. The plot labeled "c" presents the measurements from neighboring voxels across the water/fat boundary from the second ultrasound sonication in the first cadaver breast where the PRF values are from the aqueous voxel and the $T_1$ change is from the fat voxel. Note that the PRF temperature and $T_1$ change show agreement of the temporal evolution shape in FIGS. 7A-7C. The plot labeled "d" in FIG. 7 shows the $T_1$ change in a fat voxel from the second cadaver breast where PRF temperature measurements are impossible due to the lack of aqueous tissue.

Figure 8:
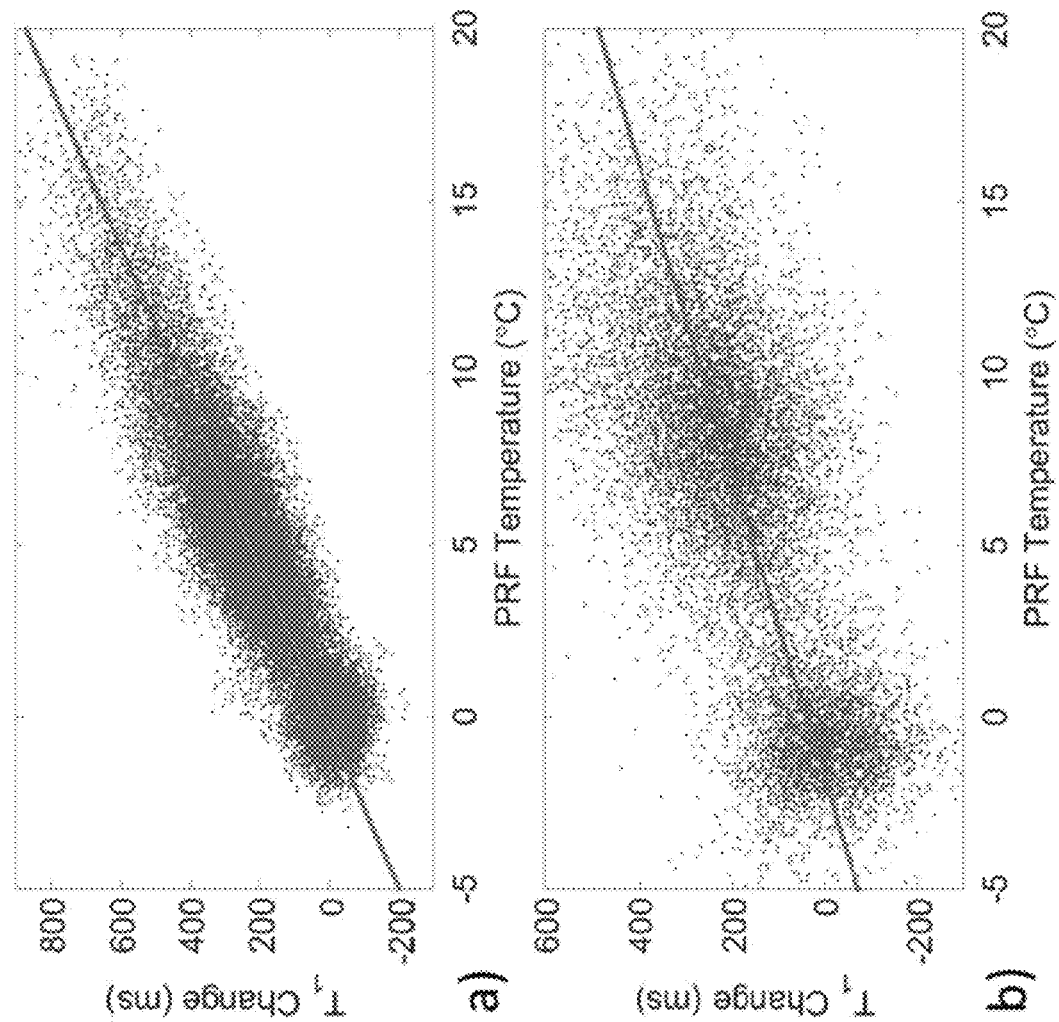
FIG. 8 shows the PRF temperature change versus $T_1$ change within only the heated region in the gelatin phantom (labeled "a") and aqueous tissue in the first cadaver breast during the first ultrasound sonication (labeled "b")

FIG. 8 shows the PRF temperature change versus $T_1$ change within only the heated region in the gelatin phantom (labeled "a") and aqueous tissue in the first cadaver breast during the first ultrasound sonication (labeled "b"). The slope of the $T_1$ change versus temperature from a linear fit to the data was 42.85 ms/° C. (R2=0.81) for the gelatin and 22.96 ms/° C. (R2=0.5) for the aqueous tissue in the first cadaver breast.

Figure 9A:
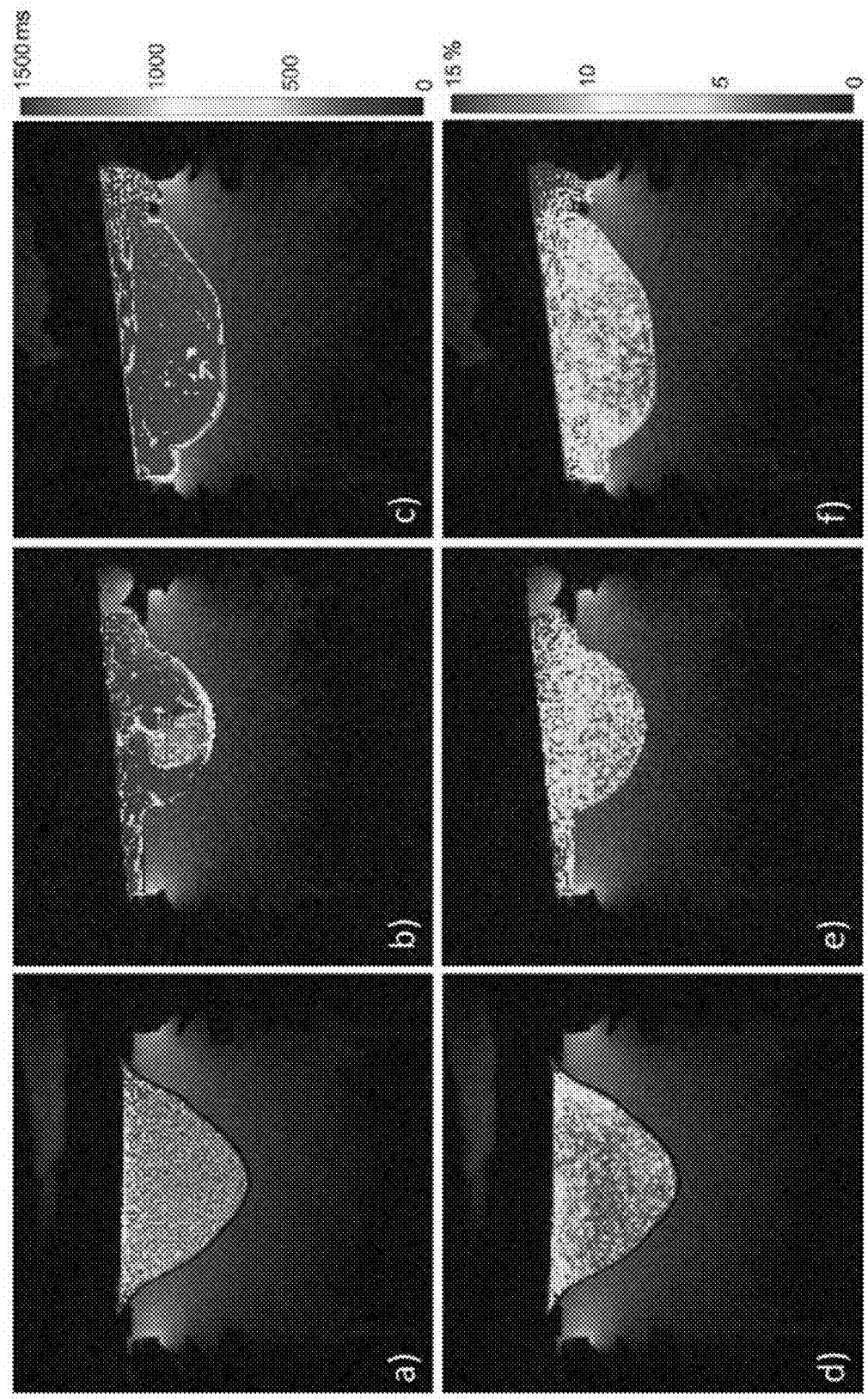
FIG. 9A shows average $T_1$ value during baseline scans for the gelatin phantom (labeled "a"), first cadaver breast (labeled "b"), and the second cadaver breast (labeled "c"), as well as the standard deviation of $T_1$ value as a percent of average value during baseline scans for the gelatin phantom (labeled "d"), first cadaver breast (labeled "e") and the second cadaver breast (labeled "f")

FIG. 9A shows average $T_1$ value during baseline scans for the gelatin phantom (labeled "a"), first cadaver breast (labeled "b"), and the second cadaver breast (labeled "c"). FIG. 9A also shows the standard deviation of the $T_1$ value as a percent of the average $T_1$ value during baseline scans for the gelatin phantom (labeled "d"), first cadaver breast (labeled "e") and the second cadaver breast (labeled "f").

Figure 9B:
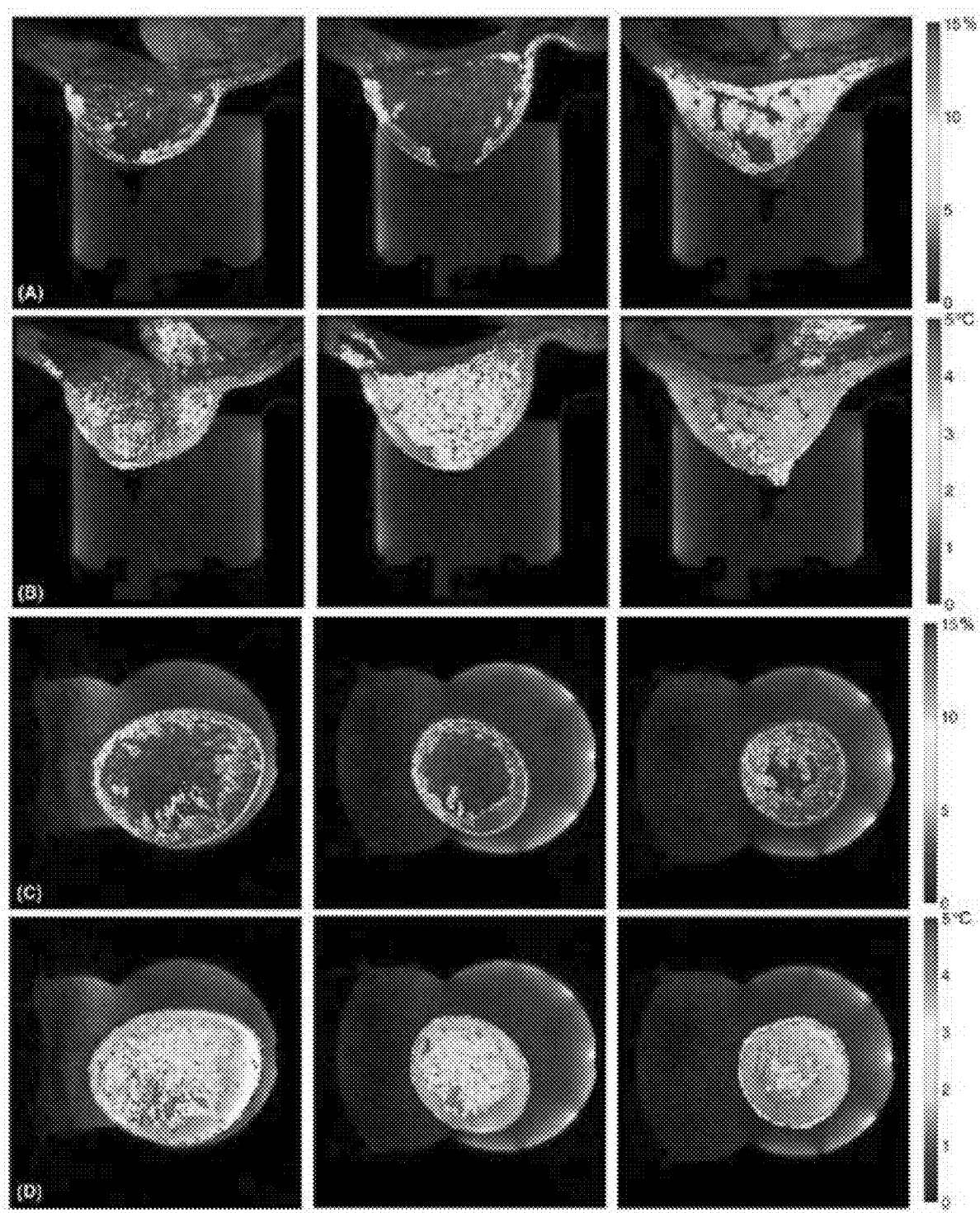
FIG. 9B shows the standard deviation of $T_1$ measurements in adipose tissue as a percent of a baseline value in three healthy volunteers in sagittal (labeled "a") and coronal (labeled "c") orientations and the standard deviation of PRF temperature measurements in aqueous tissues in sagittal (labeled "b") and coronal (labeled "d") orientations.

FIG. 9B provides the results of healthy volunteer scans for sagittal (labeled "A" and "B") and coronal (labeled "C" and "D") orientations for three volunteers. Volunteer #1 is shown in the left most column of images, volunteer #2 is shown in the middle column, and volunteer #3 is shown in the right most column. In each column, Images A and C show the standard deviation through time of $T_1$ measurements in adipose tissue as a percent of the baseline value. Images B and D show the standard deviation through time of the PRF temperature (° C.) in aqueous tissue.

DISCUSSION

This disclosure describes how simultaneous PRF temperature and $T_1$ relaxation values can be obtained using a single reference VFA method. The acquisition of these two values allows for a simultaneous measure of temperature in aqueous and adipose tissue. One significant advantage of this method is the fact that the steady state signal does not need to be adjusted between each dynamic image, which would increase scan time. This allows the $T_1$ measurement to have the same temporal resolution as the PRF temperature. The ability to measure PRF temperature and $T_1$ was demonstrated during MRgFUS sonications in a gelatin phantom and two cadaver breasts from two separate subjects. The hybrid nature of this technique can be seen in FIG. 6 where an ablation region can be seen across the water and fat boundary. The ability of the PRF temperature and $T_1$ change to provide equivalent measures is shown within aqueous tissues, where the size and shape of both the measures as well as the temporal response show good qualitative agreement.

The ability for simultaneous 3D thermometry methods will increase the monitoring accuracy of mixed tissue type targets. The described method may be implemented using a rapid image update reconstruction method, which greatly improves upon previous simultaneous techniques. The multi-echo SOS acquisition with KWIC reconstruction allowed for improved data acquisition for both $T_1$ and PRF measurements. The SNR for $T_1$ measurements is improved with shorter TE and the PRF SNR is optimal when TE=T2*. Acquiring multiple echoes allows for echo combination of the phase data to improve the PRF measurements and using the shorter TE with water/fat separation for $T_1$ measurements.

The precision of the $T_1$ measurement can further be optimized with proper choice of flip angles. Using the VFA method to measure $T_1$ will amplify noise through its non-linear nature of calculating $T_1$. Using the standard VFA method, the ideal choice of flip angles will produce ~71% of the Ernst angle signal with the two flip angles on different sides of the Ernst angle. The Monte-Carlo simulations for this single reference VFA method show that the reference flip angle should be the lower flip angle and that the optimal choice for the lower angle gives ~60% of the Ernst angle signal. A more accurate estimate of the percent of the Ernst angle signal could be simulated with much finer flip angle increments or possibly an exact estimate could be derived using the same propagation of errors method employed by Schabel M C, Morrell G R. Uncertainty in T(1) mapping using the variable flip angle method with two flip angles. Phys Med Biol 2009; 54(1):N1-8. The optimal reference flip angle will vary with TR and $T_1$ of interest. The optimal choice of dynamic flip angle, for the simulated parameters, began at 26° (~85% of Ernst signal) and as $\Delta T_1$ increased it approached the Ernst angle. Simultaneous measurements of PRF and $T_1$ need to balance the precision of both measurements (see FIG. 4). The PRF temperature is optimal when the chosen flip angle gives the highest SNR in the aqueous tissue, at the Ernst angle of the aqueous tissue. In general, aqueous tissue will have a higher $T_1$ value than adipose tissue, meaning its Ernst angle will be lower than that of adipose tissue. The precision of VFA $T_1$ measurements is relatively insensitive to changes in the larger flip angle as shown in FIGS. 3 and 4. In order to balance the precision of the PRF and $T_1$ measurements, the dynamic flip angle was chosen to be the Ernst angle of the fat tissue before heating. While this will not provide the maximum PRF SNR, it will still give more SNR than the conventional VFA method. An example aqueous tissue $T_1$=800 ms with TR=10 ms will give ~88% of its maximum signal at its Ernst angle.

The temperature dependence of $T_1$ has been investigated previously using conventional techniques. Unlike the PRF shift, the calibration of $T_1$ change to temperature is very tissue type dependent. Comparisons of the standard VFA to inversion recovery $T_1$ measurements have been done previously and are generally accepted as equally accurate although VFA provides lower SNR measurements. Calibration of $T_1$ changes with temperature using this single reference VFA to $T_1$ changes with temperature using gold standard $T_1$ measurements, e.g., inversion recovery, remains as work to be done. It has also been shown that irreversible changes to the $T_1$ value occur after tissue coagulation/death in aqueous tissue voxels. It is possible that a similar effect would be observed in adipose tissue. These effects would cause any $T_1$ temperature measurement to use a variable calibration specifically made for ablated tissue in order to be used as a reliable measure of temperature after ablation. This technique could potentially also serve as a helpful indication that the tissue has been ablated.

Figure 10:
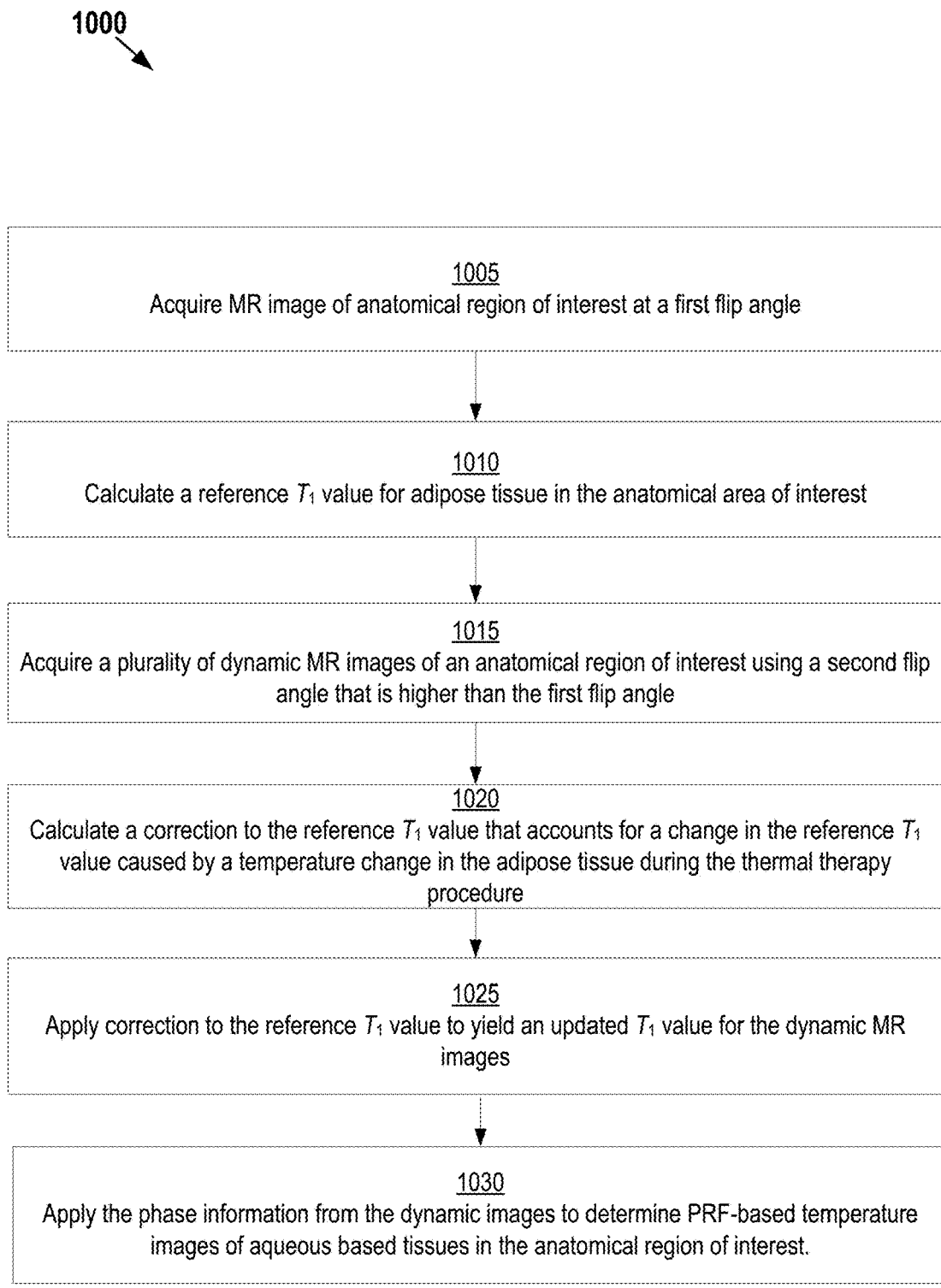
FIG. 10 shows an example method measuring $T_1$ in an anatomical region of interest during a thermal therapy procedure such as MRgFUS, according to some embodiments of the present invention.

FIG. 10 shows an example method for measuring $T_1$ in an anatomical region of interest during a thermal therapy procedure such as MRgFUS, according to some embodiments of the present invention. Starting at step 1005, an MR system acquires a reference magnetic resonance (MR) image of an anatomical region of interest using a first flip angle. One example of an MR system that may be employed in performing the acquisition is described below with reference to FIG. 1. The reference MR image is used at step 1010 to calculate a reference $T_1$ value for adipose tissue in the anatomical area of interest. As described above, one way of calculating this reference $T_1$ value is using the single reference VFA method.

Continuing with reference to FIG. 10, the MR is system is used at step 1015 to acquire a plurality of dynamic MR images of an anatomical region of interest using a second flip angle that is higher than the first flip angle. As described above, the acquisition of dynamic MR images may be performed using a multi-echo pseudo golden angle SOS acquisition. Alternatively, other acquisition techniques generally known in art may be applied. Furthermore, earlier sections of this disclosure describe how the dynamic images can be reconstructed from k-space data collected during the acquisition using a KWIC reconstruction method. But, again, it should be understood that other reconstruction techniques known in the art may be used as an alternative to KWIC.

The reference MR images and the dynamic MR images are used at step 1020 to calculate a correction to the reference $T_1$ value that accounts for a change in the reference $T_1$ value caused by a temperature change in the adipose tissue during the thermal therapy procedure. This correction is then applied at step 1025 to the reference $T_1$ value to yield an updated $T_1$ value for the dynamic MR images. This updated $T_1$ value may then be used, for example, to generate a $T_1$-weighted image of the anatomical area of interest based on the dynamic MR images.

At step 1030, the phase information from the dynamic images to determine PRF-based temperature images of aqueous based tissues in the anatomical region of interest. More specifically, one dynamic image (e.g., the first acquired dynamic image) is used as the baseline image. Each voxel in each dynamic image is associated with a PRF value. By comparing the PRF value of the dynamic images to the corresponding PRF value of the baseline image, a temperature difference map can be formed. In some embodiments, the baseline image can be adjusted over time using newly acquired images until the thermal therapy is completed.

Figure 11:
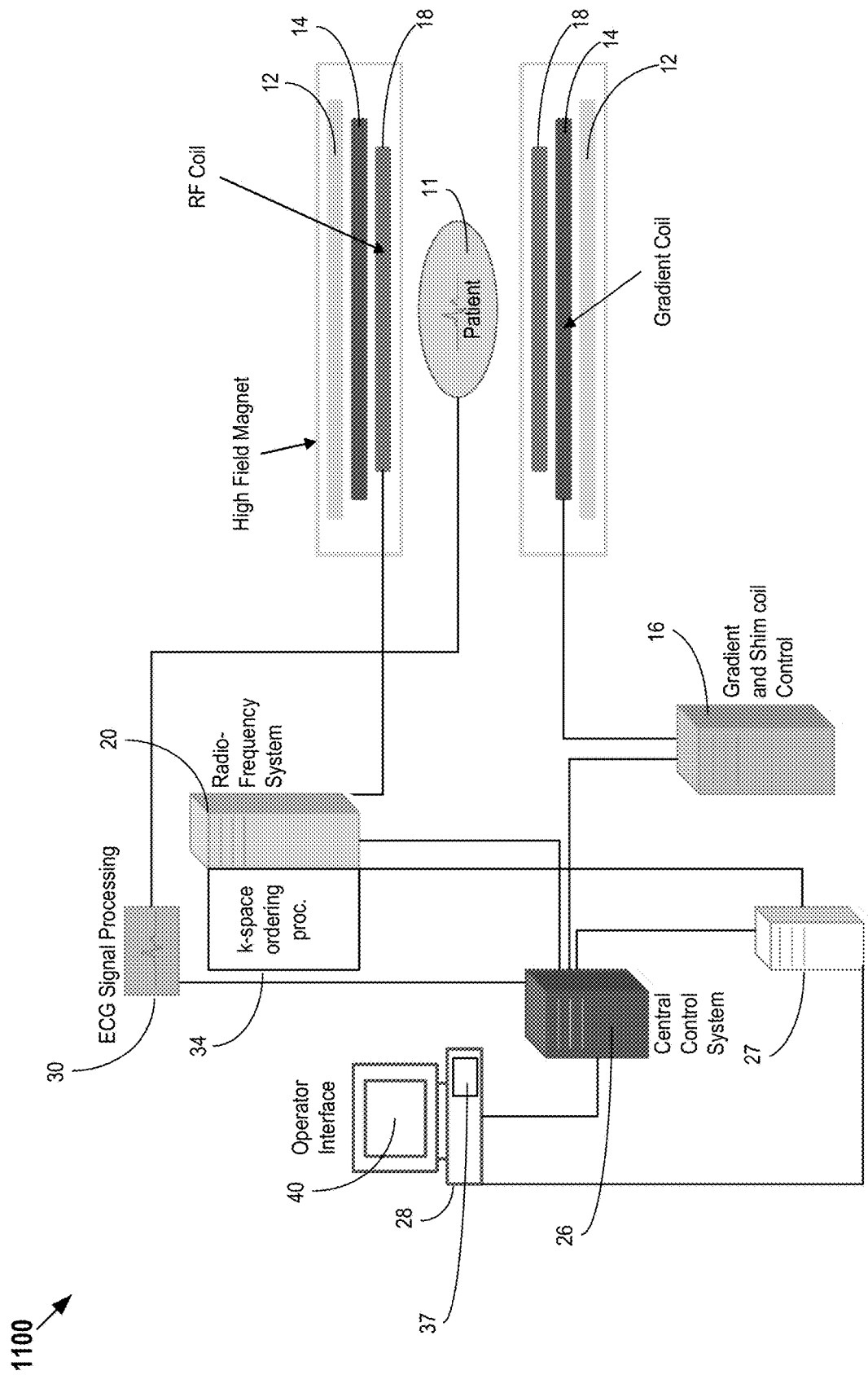
FIG. 11 shows an example MRI system that may be used in acquisition of the reference and dynamic images, according to some embodiments of the present invention.

FIG. 11 shows an example MRI system that may be used in acquisition of the reference and dynamic images, according to some embodiments of the present invention. In system 1100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control computer 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control computer 26 directs the various components of the system 1100 to acquire radial k-space data using a bSSFP sequence with an interleaved-angle asymmetric radial sampling scheme.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control computer 26. However, in other embodiments such as the one depicted in FIG. 11, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components which comprises an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control computer 26 uses information stored in an internal database to process the detected MR signals in a coordinated manner to generate high quality images of a selected slice(s) of the body (e.g., using the image data processor) and adjusts other parameters of system 1100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control computer 26 and enables user modification of magnetic resonance imaging signals in substantially real time. Display processor 37 processes the magnetic resonance signals to provide image representative data for display on display 40, for example.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

The term "computer readable medium" as used herein refers to any medium that participates in providing instructions to the processor for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk or removable media drive. One non-limiting example of volatile media is dynamic memory. Non-limiting examples of transmission media include coaxial cables, copper wire, and fiber optics, including the wires that make up one or more buses. Transmission media may also take the form of acoustic or light waves, such as those generated during radio wave and infrared data communications.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f), unless the element is expressly recited using the phrase "means for."

The invention claimed is:

1. A computer implemented method for measuring $T_1$ in an anatomical region of interest during a dynamic procedure, the method comprising:
   acquiring a reference magnetic resonance (MR) image of the anatomical region of interest using a first flip angle;
   acquiring a first set of dynamic MR images of the anatomical region of interest using a second flip angle that is distinct from the first flip angle, wherein the reference MR image and the first set of dynamic MR images are each acquired while the anatomical region of interest was at substantially the same temperature;
   using the reference MR image and the first set of dynamic MR images to calculate a reference $T_1$ value for tissue in the anatomical region of interest;
   during an intervention where the $T_1$ value may change, acquiring a second set of dynamic MR images of the anatomical region of interest using the second flip angle;
   using the reference MR image and the second set of dynamic MR images to calculate an estimated $T_1$ value; and
   using the reference $T_1$ value, the estimated $T_1$ value, and the first and second flip angles to correct the estimated $T_1$ value to take into account the change in $T_1$ value due to the intervention to obtain an updated $T_1$ value for the dynamic MR images.

2. The method of claim 1, further comprising:
   generating a $T_1$-weighted image of the anatomical region of interest using the dynamic MR images and the updated $T_1$ value.

3. The method of claim 1, further comprising:
   using phase information from the dynamic MR images to generate proton resonance frequency (PRF)-based temperature images of aqueous based tissues in the anatomical region of interest.

4. The method of claim 1, further comprising:
   producing a temperature map of the anatomical region of interest using the PRF-based temperature images.

5. The method of claim 1, wherein acquisition of dynamic MR images is performed using a multi-echo pseudo golden angle stack of stars (SOS) acquisition.

6. The method of claim 1, wherein the dynamic MR images are reconstructed from k-space data collected during the acquisition using a k-space weighted image contrast (KWIC) reconstruction method.

7. The method of claim 6, wherein the KWIC reconstruction method uses a sliding window of projections moved by a plurality of productions between each reconstruction performed to generate the dynamic MR images.

8. The method of claim 1, wherein the second flip angle used for acquisition of the dynamic MR images is the Ernst angle of the adipose tissue prior to the temperature change.

9. The method of claim 1, wherein the thermal therapy procedure is MR-guided focused ultrasound (MRgFUS).

10. An article of manufacture for measuring $T_1$ in an anatomical region of interest during a thermal therapy procedure, the article of manufacture comprising a non-transitory, tangible computer-readable medium holding computer-executable instructions for performing a method comprising:
   receiving a reference magnetic resonance (MR) image of the anatomical region of interest using a first flip angle;

receiving a first set of dynamic MR images of the anatomical region of interest using a second flip angle that is distinct from the first flip angle, wherein the reference MR image and the first set of dynamic MR images are each acquired while the anatomical region of interest was at substantially the same temperature;

using the reference MR image and the first set of dynamic MR images to calculate a reference $T_1$ value for tissue in the anatomical region of interest;

receiving a second set of dynamic MR images of the anatomical region of interest using the second flip angle, wherein the second set of dynamic MR images are acquired during an intervention where the $T_1$ value may change;

using the reference MR image and the second set of dynamic MR images to calculate an estimated $T_1$ value; and using the reference $T_1$ value, the estimated $T_1$ value, and the first and second flip angles to correct the estimated $T_1$ value to take into account the change in $T_1$ value due to the intervention to obtain an updated $T_1$ value for the dynamic MR images.

11. The article of manufacture of claim 10, wherein the method further comprises:

generating a $T_1$-weighted image of the anatomical region of interest using the dynamic MR images and the updated $T_1$ value.

12. The article of manufacture of claim 10, wherein the method further comprises:

using phase information from the dynamic MR images to generate proton resonance frequency (PRF)-based temperature images of aqueous based tissues in the anatomical region of interest.

13. The article of manufacture of claim 10, wherein the method further comprises:

producing a temperature map of the anatomical region of interest using the PRF-based temperature images.

14. The article of manufacture of claim 10, wherein acquisition of dynamic MR images is performed using a multi-echo pseudo golden angle stack of stars (SOS) acquisition.

15. The article of manufacture of claim 10, wherein the dynamic MR images are reconstructed from k-space data collected during the acquisition using a k-space weighted image contrast (KWIC) reconstruction method.

16. The article of manufacture of claim 15, wherein the KWIC reconstruction method uses a sliding window of projections moved by a plurality of productions between each reconstruction performed to generate the dynamic MR images.

17. The article of manufacture of claim 10, wherein the second flip angle used for acquisition of the dynamic MR images is the Ernst angle of the adipose tissue prior to the temperature change.

18. The article of manufacture of claim 10, wherein the thermal therapy procedure is MR-guided focused ultrasound (MRgFUS).

19. A system for measuring $T_1$ in an anatomical region of interest during a thermal therapy procedure, the system comprising:

a plurality of imaging coils used to:
acquire a reference magnetic resonance (MR) image of the anatomical region of interest using a first flip angle;
acquire a first set of dynamic MR images of the anatomical region of interest using a second flip angle that is distinct from the first flip angle, wherein the reference MR image and the first set of dynamic MR images are each acquired while the anatomical region of interest was at substantially the same temperature;
during an intervention where the $T_1$ value may change, acquire a second set of dynamic MR images of the anatomical region of interest using the second flip angle;

a control computer configured to:
use the reference MR image and the first set of dynamic MR images to calculate a reference $T_1$ value for tissue in the anatomical region of interest;
use the reference MR image and the second set of dynamic MR images to calculate an estimated $T_1$ value; and
use the reference $T_1$ value, the estimated $T_1$ value, and the first and second flip angles to correct the estimated $T_1$ value to take into account the change in $T_1$ value due to the intervention to obtain an updated $T_1$ value for the dynamic MR images.

* * * * *

UNITED STATES PATENT AND TRADEMARK OFFICE
CERTIFICATE OF CORRECTION

PATENT NO. : 10,830,853 B1  
APPLICATION NO. : 16/388931  
DATED : November 10, 2020  
INVENTOR(S) : Bryant Svedin, Dennis L. Parker and Allison Payne Page 1 of 1

It is certified that error appears in the above-identified patent and that said Letters Patent is hereby corrected as shown below:

On the Title Page

Item (73) Assignees, please delete the following assignee, --Siemens Healthcare GmbH, Erlangen (DE)--

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*